(12) United States Patent
Deking et al.

(10) Patent No.: US 12,038,208 B2
(45) Date of Patent: Jul. 16, 2024

(54) PELTIER-MODULE

(71) Applicant: Binder GmbH, Tuttlingen (DE)

(72) Inventors: Kjell Deking, Dauchingen (DE);
Emeka Ndubueze, Tuttlingen (DE);
Jochen Buschle, Nendingen (DE)

(73) Assignee: Binder GmbH, Tuttlingen (DE)

(*) Notice: Subject to any disclaimer, the term of this patent is extended or adjusted under 35 U.S.C. 154(b) by 82 days.

(21) Appl. No.: 17/749,739

(22) Filed: May 20, 2022

(65) Prior Publication Data

US 2022/0373234 A1 Nov. 24, 2022

(30) Foreign Application Priority Data

May 21, 2021 (DE) ...................... 10 2021 113 357.2

(51) Int. Cl.
*F25B 21/02* (2006.01)
*H10N 10/17* (2023.01)

(52) U.S. Cl.
CPC ............. *F25B 21/02* (2013.01); *H10N 10/17* (2023.02)

(58) Field of Classification Search
CPC ........ F25B 2321/0251; F25B 2321/023; F25B 21/02
See application file for complete search history.

(56) References Cited

U.S. PATENT DOCUMENTS

| | | | | | |
|---|---|---|---|---|---|
| 7,596,956 | B2* | 10/2009 | Lilke | ....................... | F25B 21/02 62/3.6 |
| 8,926,360 | B2* | 1/2015 | Manahan | ............... | H01R 13/46 439/485 |
| 9,849,024 | B2* | 12/2017 | Mandel | .................... | A61F 7/007 |
| 10,495,356 | B2* | 12/2019 | Ye | ............................ | F25B 21/02 |
| 10,500,994 | B1* | 12/2019 | Dry | ........................... | B60N 2/56 |
| 2006/0185711 | A1* | 8/2006 | Bang | ....................... | F25B 21/02 136/230 |

(Continued)

FOREIGN PATENT DOCUMENTS

| | | |
|---|---|---|
| DE | 202021000204 | 3/2021 |
| EP | 2980511 | 2/2016 |

(Continued)

OTHER PUBLICATIONS

European Patent Office, "European Search Report," and English translation thereof, issued in EP22171975, dated Sep. 13, 2022, document of 16 pages.

*Primary Examiner* — Filip Zec
(74) *Attorney, Agent, or Firm* — Akerman LLP; Peter A. Chiabotti

(57) ABSTRACT

A Peltier module or device with at least one Peltier element with a first surface and an oppositely located second surface, wherein on the first surface a first heat transfer element of an air duct is disposed, wherein the air duct, for the conduction of air along the first heat transfer element, comprises an input opening, in which a ventilator is disposed, and an output opening and wherein on the second surface a second heat transfer element of a cooling body is disposed, wherein the ventilator is developed and disposed such that an air flow generated by the ventilator forms with the first surface an angle (α) between 10° and 80°, as well as a laboratory chamber, a refrigerator chamber, a cold chamber, a climate chamber or an environmental simulation chamber with at least one such Peltier module.

20 Claims, 6 Drawing Sheets

(56) References Cited

U.S. PATENT DOCUMENTS

| | | | | |
|---|---|---|---|---|
| 2014/0261416 A1* | 9/2014 | Arcilla | ............. | A61M 16/0891 128/203.14 |
| 2014/0318008 A1* | 10/2014 | Smith | ..................... | A01G 5/06 47/41.01 |
| 2015/0219367 A1* | 8/2015 | Kadle | .................... | F25B 21/02 62/3.2 |

FOREIGN PATENT DOCUMENTS

| | | |
|---|---|---|
| JP | 2000304401 | 11/2000 |
| JP | 2004205052 | 7/2004 |
| JP | 2009008359 | 1/2009 |

\* cited by examiner

PELTIER-MODULE

CROSS-REFERENCE TO RELATED APPLICATIONS

This application claims priority to German Patent Application No. 10 2021 113 357.2, filed May 21, 2021, which is incorporated by reference in its entirety

BACKGROUND

The application relates to a Peltier module or device which can be employed, for example, in laboratory chambers, refrigerators, cold chambers, climate chambers or environmental simulation chambers for the cooling of the interior volume.

SUMMARY

Peltier elements are known which, when electrical energy is applied, generate a temperature difference. Such Peltier elements can be utilized for cooling in, for example refrigerators or cold chambers or also in laboratory chambers, climate chambers or environmental simulation chambers. A Peltier element is conventionally developed in the form of a rectangular solid and comprises a first surface and an oppositely disposed second surface. The first surface is in particular a portion of a first side, in particular a warmer side, and the second surface is in particular a portion of a second side, in particular a colder side. A Peltier element can conventionally establish a maximum temperature difference. Disposing a cooling element on the second surface of the Peltier element can remove heat from the ambient surrounding.

To attain especially effective cooling, it is furthermore known to aerate the first side of the Peltier element by means of a ventilator in order to reinforce the cooling effect.

In this connection, it is known to generate an air flow either perpendicularly onto the side or parallel thereto.

This device addresses the problem of providing a Peltier element with improved efficiency.

According to the disclosure the problem is resolved through a Peltier module having the features and structures recited herein.

A Peltier module according to the disclosure with at least one Peltier element having a first surface and an oppositely disposed second surface, wherein on the first surface a first heat transfer element of an air duct is disposed, wherein the air duct for guiding air along the first heat transfer element comprises an input opening, in which a ventilator is disposed, and an output opening and wherein on the second surface a second heat transfer element of a cooling body is disposed, is distinguished thereby that the ventilator is implemented and disposed such that an air flow generated by the ventilator forms with the first surface an angle between 10° and 80°. The first surface and the second surface are herein disposed, in particular, parallel to one another. Such incident flow improves the cooling effect on the first surface since heat can be better absorbed by the air and discharged through the air duct.

In one arrangement, the disclosure provides for the ventilator to be developed as an axial ventilator with a rotational axis, wherein the rotational axis is disposed at an angle between 10° and 80° with respect to the first surface. In spite of its oblique position which entails increased space requirement, the axial ventilator can be disposed on the air duct saving as much space as possible.

The angle is preferably between 10° and 50°, especially preferably between 25° and 30°. With such a disposition an especially good cooling effect can be achieved.

In another arrangement, between the first heat transfer element and the second heat transfer element laterally to the Peltier element, in particular peripherally about the Peltier element, an insulation layer is disposed. The Peltier element comprises a cross-sectional area that is smaller than the area of the first heat transfer element and/or of the second heat transfer element. The insulation layer can reduce energy losses in the region about the Peltier element.

The Peltier element is preferably disposed on a spacer element which is disposed integrally on the second heat transfer element. Such spacer element increases the distance between the first heat transfer element and the second heat transfer element and enables the reduction of the heat flow between the two heat transfer elements.

The air duct preferably comprises fins which, starting from the surface of the first heat transfer element, extend perpendicularly to this surface in the direction toward a section running parallel to this surface, of a housing. Such fins noticeably improve the cooling effect attained through the air flow.

This applies notably when the fins extend up to the section, running parallel to this surface, of the housing such that in the air duct a multiplicity of continuous cooling channels is generated whose walls are in each case formed by adjacent fins and the sections, connecting them, of the surfaces of the first heat transfer element and of the housing.

Moreover, the effect attainable with the fins can still be further enhanced if the front sides, located oppositely to the output opening, of the fins extend obliquely and are located in a plane whose normal vector also extends at angle $\alpha$ with respect to the first surface.

The Peltier module can advantageously comprise at least two Peltier elements with a first surface and an oppositely disposed second surface, wherein on each of the Peltier elements on the first surface a first heat transfer element of an air duct is disposed, wherein the air duct for conducting air along the first heat transfer element comprises an input opening in which a ventilator is disposed and an output opening, and wherein the two Peltier elements are disposed with their second surfaces on a single second heat transfer element of a cooling body. Such implementation can further improve the cooling effect.

The Peltier element preferably comprises at least two series-connected sub-Peltier elements. Through such an implementation the area of the Peltier element can be developed in a desirable manner. Furthermore, through such implementation a preset supply voltage of the device, in which the Peltier element is applied, can be better utilized. For example, at a supply voltage of 24 VDC two sub-Peltier elements can be connected in series each with a supply voltage of 12 VDC.

In another arrangement, the device provides for cooling fins to be disposed on the cooling body, which fins in particular are disposed perpendicularly to the second surface of the Peltier element. Through such implementation the removal of heat from the ambient surrounding of the cooling body can be improved.

A Peltier module as disclosed can be applied in a laboratory chamber, a refrigerator, a cold chamber, a climate chamber or an environmental simulation chamber.

A laboratory chamber, refrigerator, cold chamber, climate chamber or environmental simulation chamber with an inner housing, an outer housing, an insulation layer disposed between the inner housing and the outer housing, comprises at least one Peltier module according to the disclosure which is disposed such that the air duct is disposed on the outer side of the outer housing and the cooling body is disposed on the inner side of the inner housing.

BRIEF DESCRIPTION OF THE DRAWINGS

The disclosure will be explained in conjunction with an embodiment example depicted in the Figures. Therein show.

DETAILED DESCRIPTION

Figure 1:
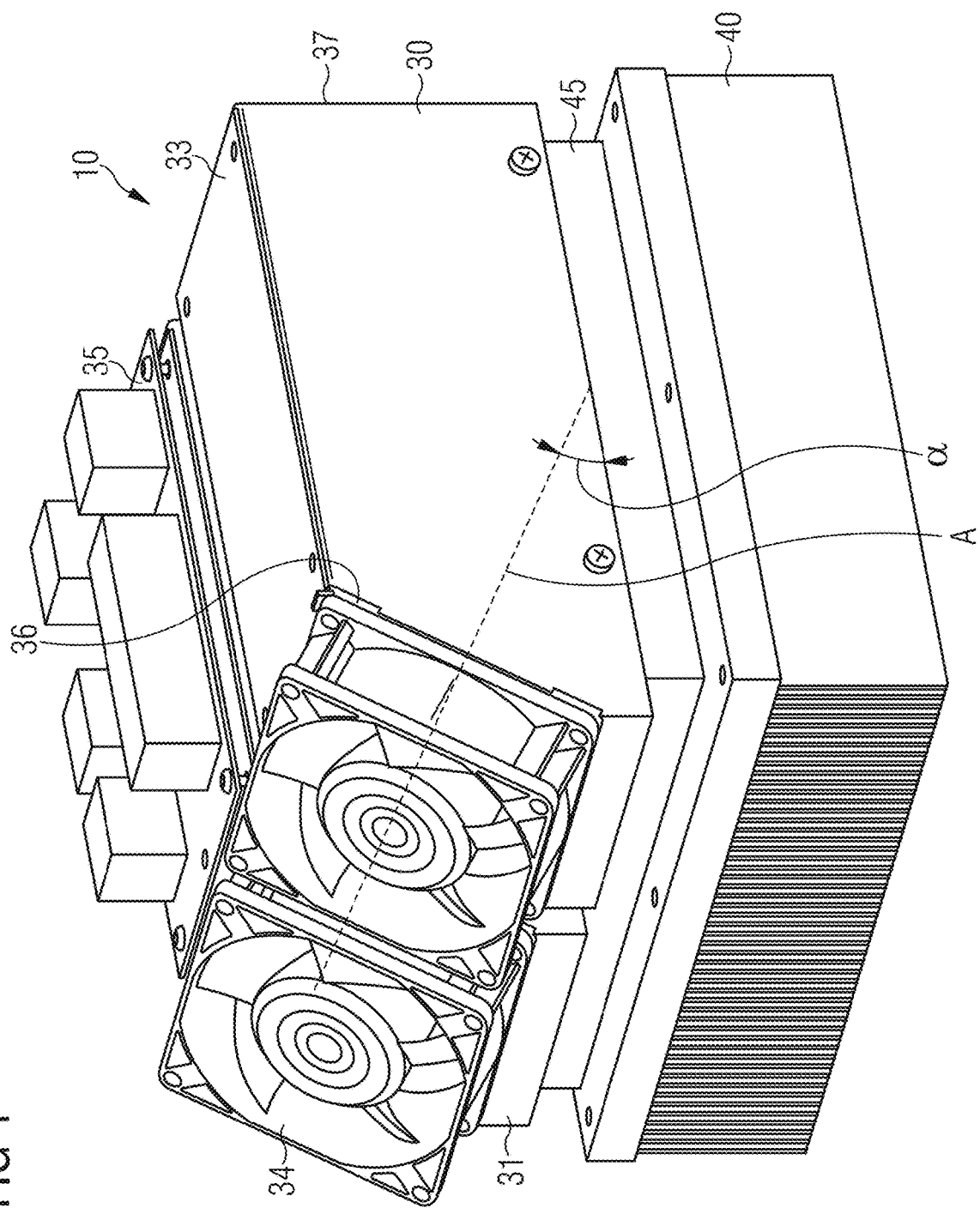
FIG. 1 a perspective view of an embodiment example of a Peltier module according to the disclosure, FIG. 2 a further perspective view of the Peltier module corresponding to FIG. 1, FIG. 3 an exploded representation of the Peltier module corresponding to FIG. 1, with blanked out cover plate and blanked out electronic control unit, FIG. 4 a longitudinal section through a laboratory chamber with an inner housing, an outer housing and at least one Peltier module corresponding to FIG. 1, FIG. 5 a cutout of a plan view onto the inner side of the inner housing of the laboratory chamber corresponding to FIG. 4, and FIG. 6 a cutout of a plan view onto the outer side of the outer housing of the laboratory chamber corresponding to FIG. 4.
Figure 2:
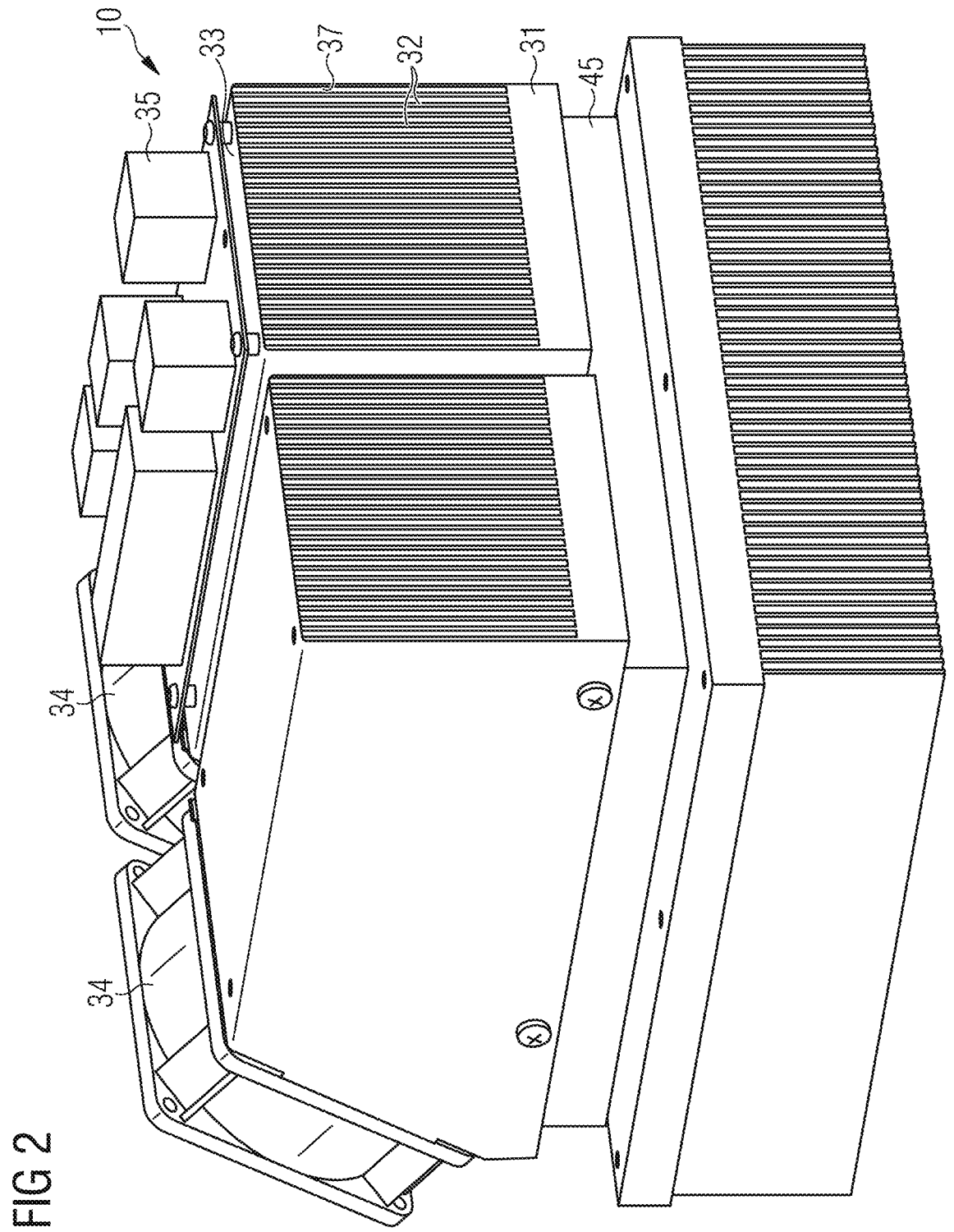
Figure 3:
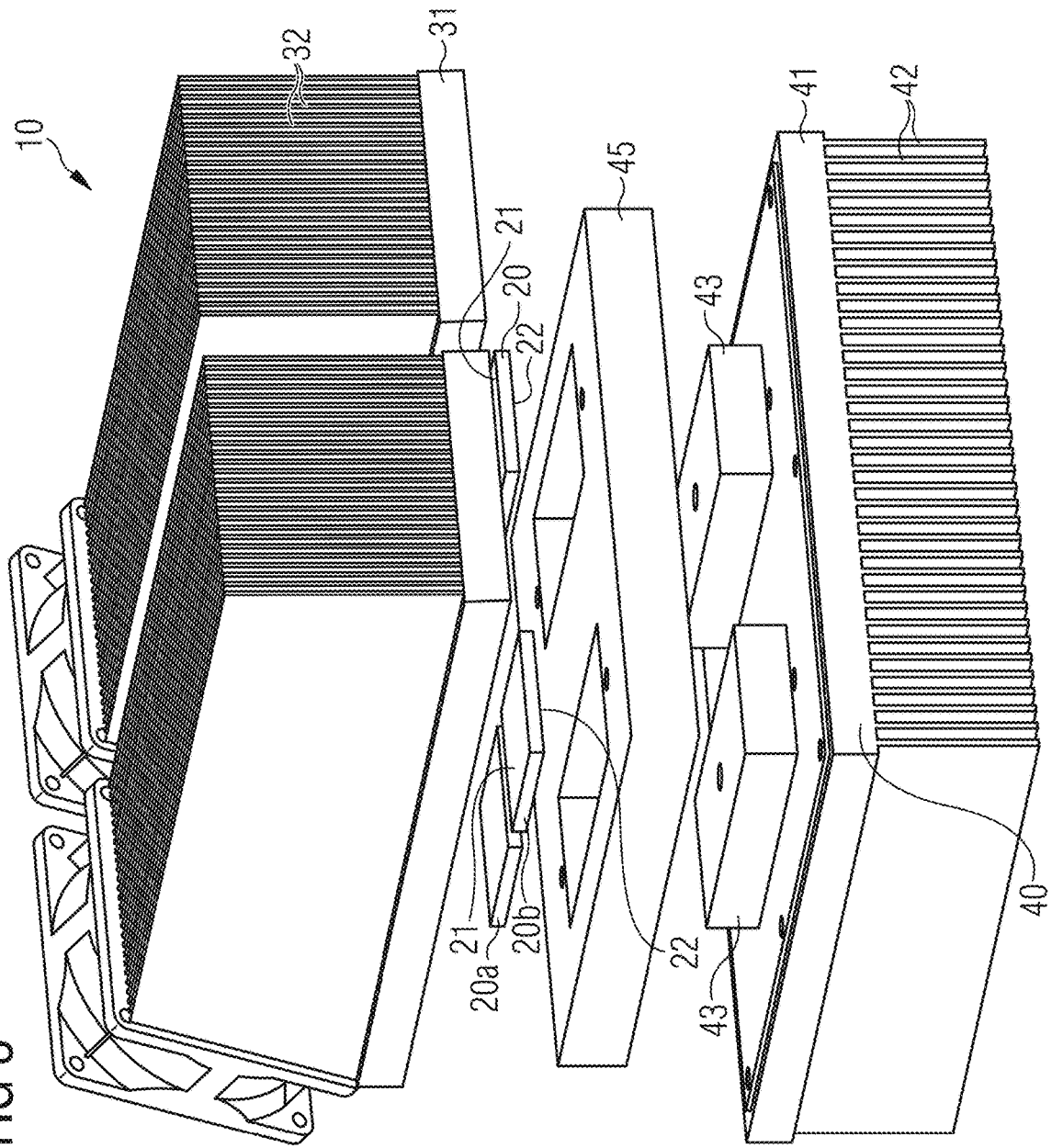

FIGS. 1 to 3 show different views of an embodiment example of a Peltier module 10 according to the disclosure. The Peltier module 10 comprises at least one Peltier element 20 with a first surface 21 and an oppositely located second surface 22. The Peltier element 20 can be developed in the form of a rectangular solid for example, wherein the first surface 21 and the second surface 22 are implemented parallel to one another. The Peltier element 20 conventionally comprises a first warmer side and a second colder side, wherein in the present case, for example, the first surface 21 for example forms the outer side of the first side and the second surface 22 forms the outer side of the second side. When applied electric current flows through the peltier element 20 a temperature difference develops between the first side and the second side.

It is feasible for the Peltier element 20 to comprise two or more series-connected sub-Peltier elements 20a, 20b.

On the first surface 21 a first heat transfer element 31 of an air duct 30 is disposed. The air duct 30 is developed for the conduction of air along the first heat transfer element 31, in particular substantially parallel to the first surface 21 of the Peltier element 20. The air duct 30 comprises an input opening 36, in which a ventilator 34 is disposed, and an output opening 37, wherein in particular the Peltier element 20, viewed in a projection, is disposed between the input opening 36 and the output opening 37. On the first heat transfer element 31 fins 32 can be disposed which can improve the heat absorption and heat emission.

The heat transfer element 31 can be covered in particular by a housing 33 which can encompass in particular the input opening 36 and the output opening 37. The air duct 30 extends from the input opening 36 up to the output opening 37.

The ventilator 34 is implemented and disposed such that an air flow generated by the ventilator 34 forms with the first surface 21 an angle α between 10° and 80°, preferably between 10° and 50°, especially preferred between 25° and 30°. The ventilator 34 can be implemented, for example, as an axial ventilator with a rotational axis A, wherein the rotational axis A is disposed at the described angle α with respect to the first surface 21.

Figure 6:
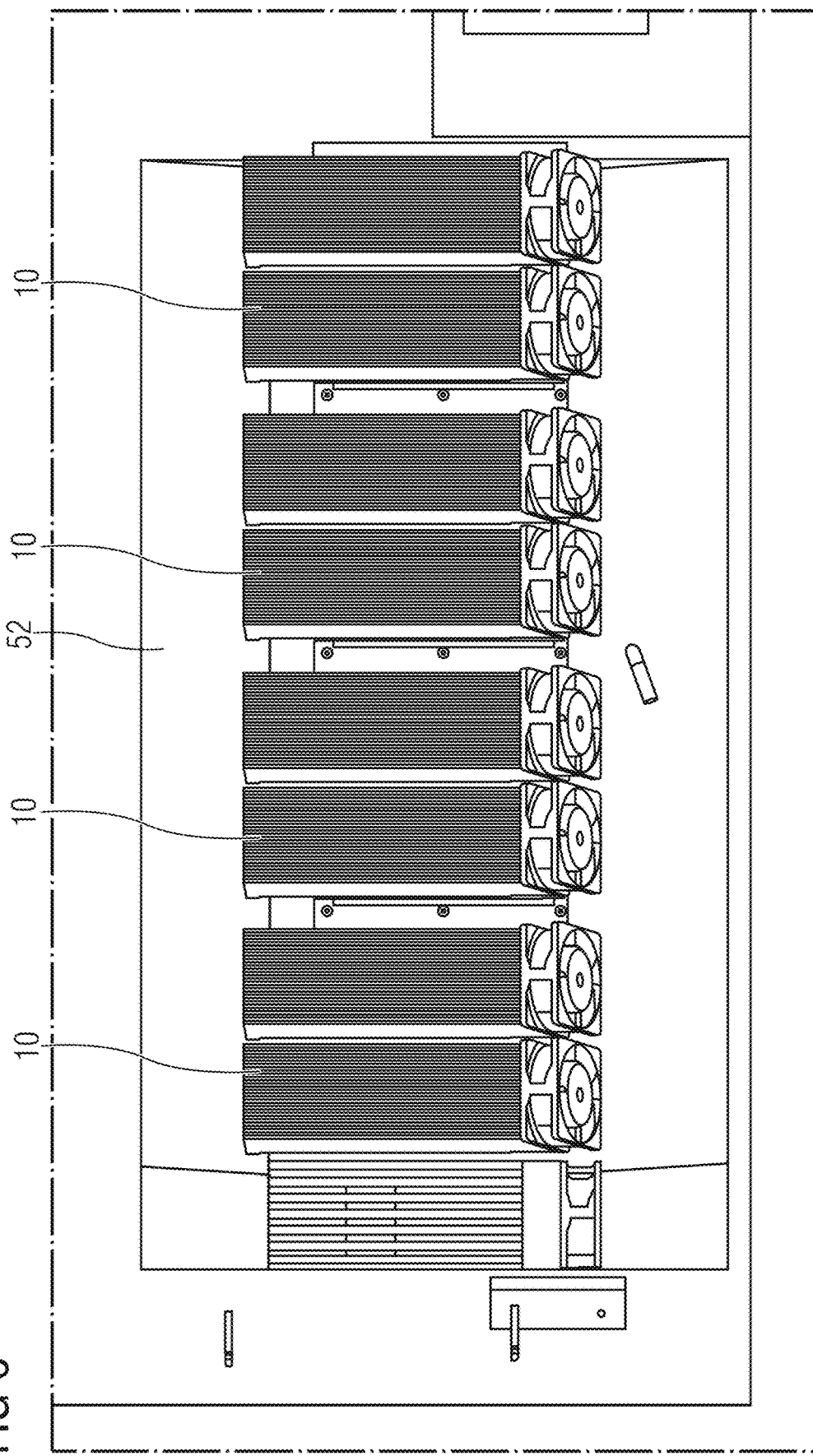

As is especially clearly discernible in FIGS. 3 and 6, the geometry of fins 32 is adapted to the geometry of the ventilator 34 such that the air flow is conducted between the fins 32 over its entire path between ventilator 34 and output opening 37.

In practice this is achieved thereby that the ventilator 34 is disposed directly at the front side, located oppositely to the output opening 37, of the fins 32, thus directly or at a distance of a few mm, and preferably is in contact not only with a portion but completely.

This is in particular enable thereby that these front sides of fins 32 extend obliquely and are located in a plane whose normal vector also extends at the described angle α with respect to the first surface 21 and can be described by the direction of the ventilator axis A if the ventilator is an axial ventilator.

Moreover, the length of the front sides of fins 32 corresponds substantially to the extension of the ventilator 34 in this direction, The air flow from the ventilator 34 over the entire extension of the ventilator 34 is directly incident between the fins 32. Each of these measures contributes substantially to an especially efficient cooling by the air stream of the ventilator 34.

The height of fins 32, as is clearly visible in FIGS. 2 and 3, is preferably simultaneously selected such that, starting from the surface of the first heat transfer element 31, it extends perpendicularly to this surface up to a section, extending parallel to this surface, of housing 33. Thereby preferably a multiplicity of continuous cooling channels is generated whose walls are substantially formed by adjacent fins 32 and the sections, connecting these, of the surface of the first heat transfer element 31 and of housing 33, which also further improves cooling.

The Peltier module 10 can comprise an electronic control unit 35 which, in particular, can be disposed on housing 33. By means of the electronic control unit 35, for example, the rotational speed of the ventilator 34 can be controlled. Furthermore, by means of the electronic control unit 35 the current amperage and, if necessary, also the direction of the current flowing through the Peltier element 20 can be controlled. The supply voltage of the electronic control unit 35 can be, for example 24 VDC. The Peltier element 20 can have a supply voltage of 24 VDC. Each of the sub-Peltier modules 20a, 20b can have a supply voltage, for example, of 12 VDC.

On the second surface 22 of the Peltier element 10 is disposed a second heat transfer element 41 of a cooling body 40. On the cooling body 40 cooling fins 42 can be disposed which are disposed, in particular, perpendicularly to the second surface 22 of the Peltier element 20.

The Peltier element 20 can be disposed on a spacer element 43 (cf. FIG. 3) which can be disposed, in particular integrally, on the second heat transfer element 41. The distance between the first heat transfer element 31 and the second heat transfer element 41 can be increased by means of the spacer element 43 in order to be able to decrease the heat flow between the first heat transfer element 31 and the second heat transfer element 41.

The area of the Peltier element 20, i.e. in particular the area of the first surface 21 or of the second surface 22, is conventionally less than the area of the first heat transfer element 31 and/or of the second heat transfer element 41. For the purpose of insulation, between the first heat transfer element 31 and the second heat transfer element 41, then, laterally of the Peltier element 20, in particular peripherally around the Peltier element 20, an insulation layer 45 can be disposed (cf. FIG. 3). If the Peltier element 20 is disposed on a spacer element 43, the insulation layer 45 can also be disposed peripherally about the spacer element 43.

The Peltier module 10 can comprise at least two Peltier elements 20, in the embodiment example shown in FIGS. 1 to 3 precisely two Peltier elements 20, each with a first surface 21 and an oppositely located second surface 22, wherein on each of the Peltier elements 20 on the first surface 21 a first heat transfer element 31 of an air duct 30 is disposed, wherein the air duct 30 for the conduction of air along the first heat transfer element 31 comprises an input opening 36, in which a ventilator 34 is disposed, and an output opening 37, and wherein the two Peltier elements 20 with their second surface 22 are disposed on a single second heat transfer element 41 of a cooling body 40. The control of the two ventilators 34 and the two Peltier elements 20 can take place across a common electronic control unit 35.

Figure 4:
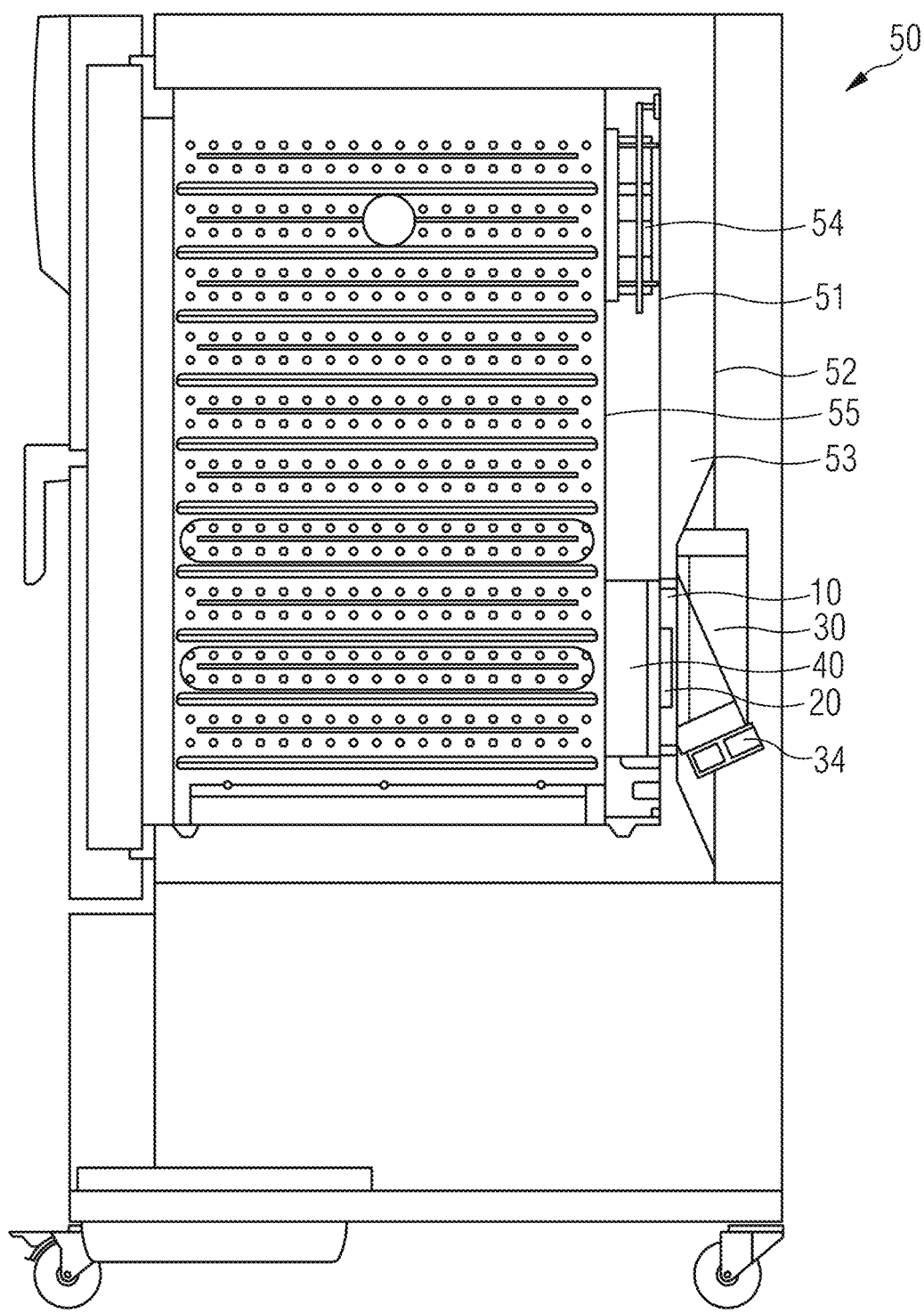
Figure 5:
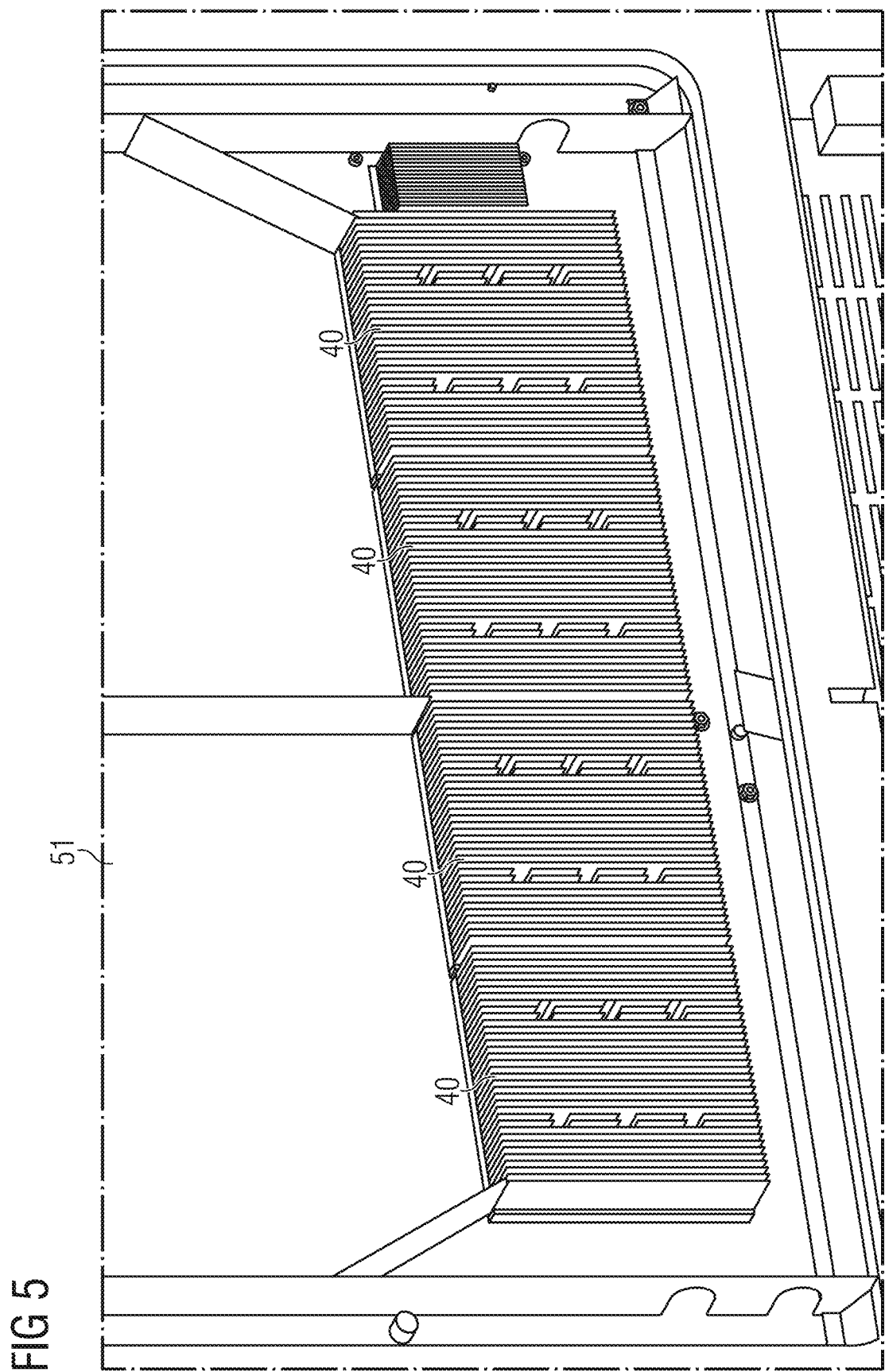

FIGS. 4 to 6 show by example a laboratory chamber 50 with at least one Peltier module 10, in particular four Peltier modules 10, according to FIGS. 1 to 3. However, it is understood that instead of a laboratory chamber 50, a refrigerator, a cold chamber, a climate chamber or an environmental simulation chamber or other chamber in which the interior volume is to be cooled, can be equipped with at least one Peltier module 10 according to FIGS. 1 to 3.

The laboratory chamber 50 comprises an inner housing 51, an outer housing 52, and an insulation layer 53 disposed between the inner housing 51 and the outer housing 52.

As is discernible in particular in FIG. 4, the at least one Peltier module 10 is disposed such that the air duct 30 is disposed on the outer side of the outer housing 52, and the cooling body 40 is disposed on the inner side of inner housing 51. As the outer side of the outer housing 52 is herein understood to be that side of the outer housing 52 that faces away from the inner housing 51, and as the inner side of inner housing 51 is understood to be that side of the inner housing that faces away from outer housing 52. The cooling body 40 can, for example, be emplaced from the inner side of inner housing 51 and be secured by means of bolts. To avoid thermal bridges caused by the bolts, the bolts can be disposed guided in an insulating sleeve. The heads of the bolts can be covered with an insulating cap.

FIG. 5 shows a cutout view of the inner side of inner housing 51 in which several, in the present case four, cooling bodies 40 are disposed adjacently to one another such that the cooling fins 42 project into the interior volume. There is the feasibility, by means of a further ventilator 54 which can be implemented, for example, as a radial ventilator, to draw air from the interior volume of the inner housing 51 and conduct it along the cooling fins 42 of cooling body 40 in order to improve the heat transfer between ambient air and cooling fins 42. It is advantageous for such an air conductance to dispose an air guidance wall 55 at a spacing from the wall of the inner housing 51.

LIST OF REFERENCE NUMBERS

10 Peltier module
20 Peltier element
20a Sub-Peltier element
20b Sub-Peltier element
21 First surface
22 Second surface
30 Air duct
31 First heat transfer element
32 Fin
33 Housing
34 Ventilator
35 Electronic control unit
36 Input opening
37 Output opening
40 Cooling body
41 Second heat transfer element
42 Cooling fin
43 Spacer element
45 Insulation layer
50 Laboratory chamber
51 Inner housing
52 Outer housing
53 Insulation layer
54 Ventilator
55 Air guidance wall
α Angle
A Rotational axis

The invention claimed is:

1. A peltier device, comprising:
a peltier element with a first surface and an oppositely located second surface;
wherein on the first surface a first heat transfer element of an air duct is disposed;
wherein the air duct, for the conduction of air along the first heat transfer element, comprises an input opening, in which a ventilator is disposed, and an output opening;
wherein the air duct comprises fins which, starting from the surface of the first heat transfer element, extend perpendicularly to the surface of the first heat transfer element in the direction toward a section, parallel to this surface, of a housing;
wherein front sides of the fins, opposite the output opening, extend obliquely and are in a plane whose normal vector also extends at an angle (a) with respect to the first surface;
wherein on the second surface a second heat transfer element of a cooling body is disposed; and
wherein the ventilator is arranged such that an air flow generated by the ventilator forms an angle (a) between 10° and 80° with the first surface.

2. The peltier device of claim 1, wherein the ventilator is an axial ventilator with a rotational axis (A), and the rotational axis (A) forms an angle (a) between 10° and 80° with the first surface.

3. The peltier device of claim 2, wherein the angle (a) is between 10° and 50°.

4. The peltier device of claim 3, wherein the angle (a) is between 25° and 30°.

5. The peltier device of claim 1, wherein an insulation layer is disposed, between the first heat transfer element and the second heat transfer element, laterally to the Peltier element, and peripherally about the Peltier element.

6. The peltier device of claim 1, wherein the peltier element is disposed on a spacer element, the spacer element being disposed on the second heat transfer element of the cooling body.

7. The peltier device of claim 1, wherein the fins extend up to the section, extending parallel to the surface of the housing, such that in the air duct a plurality of continuous cooling channels are generated whose walls in each instance are developed through adjacent fins and the sections, connecting them, of the surface of the first heat transfer element and of the housing.

8. The peltier device of claim 7, wherein the front sides of the fins, opposite the output opening, extend obliquely and are in a plane whose normal vector also extends at an angle (a) with respect to the first surface.

9. The peltier device of claim 1, comprising:
a second peltier element having with a first surface and an oppositely located second surface;
a first heat transfer element of an air duct disposed on each first surface of the peltier element and the second peltier element, wherein the air duct for the conduction of air along the first heat transfer element comprises:
an input opening, in which a ventilator is disposed; and
an output opening; and
wherein the peltier element and the second peltier element are disposed with their second surface on a single second heat transfer element of a cooling body.

10. The peltier device of claim 9, wherein the each of the peltier element and the second peltier element comprises at least two sub-peltier elements connected in series.

11. The peltier device of claim 9, wherein fins are disposed on the cooling body perpendicularly to the second surface of the peltier element and the second surface of the second peltier element.

12. The peltier device of claim 1, further comprising a laboratory chamber, a refrigerator, a cold chamber, a climate chamber, an environmental simulation chamber, or a combination thereof.

13. The peltier device of claim 12, wherein the laboratory chamber, the refrigerator, the cold chamber, the climate chamber, the environmental simulation chamber, or a combination thereof further comprises:
an inner housing;
an outer housing;
an insulation layer disposed between the inner housing and the outer housing; and
wherein the peltier element is disposed such that the air duct is disposed on the outer side of the outer housing and the cooling body is disposed on the inner side of the inner housing.

14. A peltier device, comprising:
a peltier element having a first peltier element surface and a second peltier element surface opposite the first peltier element surface;
an air duct having an input opening, an output opening, and a first heat transfer portion of the air duct, wherein the first heat transfer portion is in thermal contact with the first peltier element surface;
wherein the air duct comprises fins which, starting from the surface of the first heat transfer portion, extend perpendicularly to the surface of the first heat transfer portion in the direction toward a section, parallel to this surface, of a housing;
wherein front sides of the fins, opposite the output opening, extend obliquely and are in a plane whose normal vector also extends at an angle (a) with respect to the first peltier element surface;
a cooling body having a second heat transfer portion, wherein the second heat transfer portion is in thermal contact with the second peltier element surface; and
an air duct fan arranged on the air duct such that an airflow generated by the air duct fan flows at an angle (a) between 10° and 80° relative to a surface of the first heat transfer portion.

15. The peltier device of claim 14, wherein the angle (a) is between 25° and 30°.

16. The peltier device of claim 14, further comprising a spacer element located between, and in thermal contact with, the second heat transfer portion and the second peltier element surface.

17. The peltier device of claim 14, wherein the air duct further comprises:
a housing;
wherein each fin having a first fin end and second fin end opposite the first fin end;
wherein each first fin end is disposed on a surface of the first heat transfer portion and extends perpendicularly from the first heat transfer portion toward a second surface.

18. The peltier device of claim 16, further comprising insulation arranged between the first heat transfer portion and the second heat transfer portion and peripherally about the peltier element.

19. The peltier device of claim 1, wherein the ventilator is located at the front side of the fins opposite to the output opening.

20. The peltier device of claim 1, wherein a length of the front of the fins corresponds to an extension of the ventilator in this direction.

* * * * *